(12) United States Patent
Zeng et al.

(10) Patent No.: US 11,434,128 B2
(45) Date of Patent: Sep. 6, 2022

(54) ACTUATOR AND MANUFACTURE METHOD THEREOF, OPERATION METHOD THEREOF, AND MOVABLE DEVICE

(71) Applicants: Hefei Xinsheng Optoelectronics Technology Co., Ltd., Anhui (CN); BOE Technology Group Co., Ltd., Beijing (CN)

(72) Inventors: Suwei Zeng, Beijing (CN); Gu Yao, Beijing (CN); Yu Wang, Beijing (CN); Ruhui Zhu, Beijing (CN); Qinghua Zou, Beijing (CN)

(73) Assignees: Hefei Xinsheng Optoelectronics Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 232 days.

(21) Appl. No.: 16/754,570

(22) PCT Filed: Jan. 14, 2019

(86) PCT No.: PCT/CN2019/071640
§ 371 (c)(1),
(2) Date: Apr. 8, 2020

(87) PCT Pub. No.: WO2020/146979
PCT Pub. Date: Jul. 23, 2020

(65) Prior Publication Data
US 2021/0221672 A1    Jul. 22, 2021

(51) Int. Cl.
*B81B 3/00* (2006.01)
*B81C 1/00* (2006.01)
*F03G 7/00* (2006.01)
*H01L 27/146* (2006.01)

(52) U.S. Cl.
CPC .......... *B81B 3/0029* (2013.01); *B81B 3/0064* (2013.01); *B81C 1/0019* (2013.01); *F03G 7/016* (2021.08); *H01L 27/14601* (2013.01)

(58) Field of Classification Search
CPC ... B81B 3/0029; B81B 3/0064; B81C 1/0019; F03G 7/016; H01L 27/14601
See application file for complete search history.

(56) References Cited

U.S. PATENT DOCUMENTS

2010/0038564 A1   2/2010   Gillies et al.
2012/0175529 A1   7/2012   Naciri et al.
(Continued)

FOREIGN PATENT DOCUMENTS

CN    101516764 A    8/2009
CN    102615885 A    8/2012
(Continued)

OTHER PUBLICATIONS

NPL1-Zhou, et al., "Photodeformable Polymers", Polymer Bulletin, Jun. 2008, with English Abstract, 6 pages.
(Continued)

*Primary Examiner* — Hoang M Nguyen
(74) *Attorney, Agent, or Firm* — Banner & Witcoff, Ltd.

(57) ABSTRACT

An actuator and a manufacture method thereof, an operation method thereof, and a movable device. The actuator includes a photodeformation layer and a first driving unit, the first driving unit includes at least one first light emitting device, the first light emitting device is connected to a first side of the photodeformation layer, the first light emitting device is capable of emitting first light with a first wavelength to irradiate onto the photodeformation layer, and the photodeformation layer can generate a first deformation under irradiation of the first light.

12 Claims, 8 Drawing Sheets

(56) References Cited

U.S. PATENT DOCUMENTS

| | | | | |
|---|---|---|---|---|
| 2015/0359065 | A1* | 12/2015 | Park | H05B 33/26 |
| | | | | 313/511 |
| 2017/0372683 | A1* | 12/2017 | Du | H04N 13/307 |
| 2018/0033356 | A1* | 2/2018 | Zhou | G09G 3/007 |
| 2019/0213978 | A1 | 7/2019 | Jia et al. | |
| 2020/0176300 | A1* | 6/2020 | Zou | H01L 21/67011 |

FOREIGN PATENT DOCUMENTS

| | | |
|---|---|---|
| CN | 204352378 U | 5/2015 |
| CN | 105411010 A | 3/2016 |
| CN | 106910432 A | 6/2017 |
| CN | 107291245 A | 10/2017 |
| CN | 108258019 A | 7/2018 |
| CN | 108711371 A | 10/2018 |
| WO | 2018219745 A1 | 12/2018 |

OTHER PUBLICATIONS

NPL2-Wei, "Fabrication Characterization and Application of Light Induced Polyvinyl Alcohol Shape Memory Polymer", Dissertation for the Master Degree in Engineering, Harbin Institute of Technology, with English Abstract, 67 pages.

NPL3-Zhang, et al., "Visual Feedback Tracking System Design of Optical Micro Swimming Robot", Journal of Shenyang University of Chemical Technology, Sep. 2016, vol. 30, No. 3, with English Translation, 4 pages.

* cited by examiner

ACTUATOR AND MANUFACTURE METHOD THEREOF, OPERATION METHOD THEREOF, AND MOVABLE DEVICE

The application is a U.S. National Phase Entry of International Application No. PCT/CN2019/071640 filed on Jan. 14, 2019, designating the United States of America. The present application claims priority to and the benefit of the above-identified application and the above-identified application is incorporated by reference herein in its entirety.

TECHNICAL FIELD

Embodiments of the present disclosure relate to an actuator and a manufacture method thereof, an operation method thereof, and a movable device.

BACKGROUND

An actuator is a device that can be driven to move to produce a driving (pushing or pulling) effect, and for example, the actuator can be combined with other functional devices. The actuator may drive a functional device loaded thereon in a predetermined direction or path according to a control instruction, thereby transporting the functional device to a predetermined position. Generally speaking, the actuator includes driving elements using electrical, magnetic or mechanical structures for driving. These driving elements are usually mounted inside the actuator and have certain structures.

SUMMARY

Some embodiments of the present disclosure provide an actuator, the actuator comprises a photodeformation layer and a first driving unit; the first driving unit comprises at least one first light emitting device, the first light emitting device is connected to a first side of the photodeformation layer and is capable of emitting first light with a first wavelength to irradiate onto the photodeformation layer; the photodeformation layer is capable of generating a first deformation under irradiation of the first light.

For example, the actuator provided by at least one embodiment of the present disclosure further comprises a second driving unit, the second driving unit comprises at least one second light emitting device, the second light emitting device is connected to a second side of the photodeformation layer, and is capable of emitting second light with the first wavelength to irradiate onto the photodeformation layer, and the first side and the second side of the photodeformation layer are opposite to each other.

For example, in the actuator provided by at least one embodiment of the present disclosure, the first driving unit further comprises at least one third light emitting device, the third light emitting device is connected to the first side of the photodeformation layer, and is capable of emitting third light with a second wavelength to irradiate onto the photodeformation layer, and the photodeformation layer, which is deformed, generates a second deformation under irradiation of the third light with the second wavelength, the first wavelength is different from the second wavelength, and a deformation direction of the first deformation and a deformation direction of the second deformation are opposite.

For example, the actuator provided by at least one embodiment of the present disclosure further comprises a second driving unit, the second driving unit comprises at least one second light emitting device and at least one fourth light emitting device, the second light emitting device and the fourth light emitting device are connected to a second side of the photodeformation layer, the second light emitting device is capable of emitting second light with the first wavelength to irradiate onto the photodeformation layer, and the fourth light emitting device is capable of emitting fourth light with the second wavelength to irradiate onto the photodeformation layer, and the first side and the second side of the photodeformation layer are opposite to each other.

For example, in the actuator provided by at least one embodiment of the present disclosure, the first driving unit comprises a plurality of first light emitting devices and a plurality of third light emitting devices, and the second driving unit comprises a plurality of second light emitting devices and a plurality of fourth light emitting devices; in a direction parallel to an extending direction of the photodeformation layer, the first light emitting devices are interlaced with the third light emitting devices, and the second light emitting devices are interlaced with the fourth light emitting devices.

For example, in the actuator provided by at least one embodiment of the present disclosure, in a direction perpendicular to a layer surface of the photodeformation layer, the first light emitting devices and the fourth light emitting devices are overlapped with each other, and the second light emitting devices and the third light emitting devices are overlapped with each other.

For example, in the actuator provided by at least one embodiment of the present disclosure, the first driving unit further comprises at least one fifth light emitting device, the fifth light emitting device is connected to a second side of the photodeformation layer, and is capable of emitting fifth light with a second wavelength to irradiate onto the photodeformation layer, the photodeformation layer generates a second deformation under irradiation of the fifth light with the second wavelength, the first wavelength is different from the second wavelength, a deformation direction of the first deformation and a deformation direction of the second deformation are opposite, and the first side and the second side of the photodeformation layer are opposite to each other.

For example, the actuator provided by at least one embodiment of the present disclosure further comprises a second driving unit, the second driving unit comprises at least one sixth light emitting device and at least one seventh light emitting device; the sixth light emitting device is connected to the second side of the photodeformation layer, and is capable of emitting sixth light with the first wavelength to irradiate onto the photodeformation layer, the seventh light emitting device is connected to the first side of the photodeformation layer, and is capable of emitting seventh light with the second wavelength to irradiate onto the photodeformation layer; in a direction perpendicular to a layer surface of the photodeformation layer, the sixth light emitting device and the seventh light emitting device are overlapped with each other.

For example, in the actuator provided by at least one embodiment of the present disclosure, a material of the photodeformation layer comprises: azobenzene, triphenylmethane derivative, copolymers containing cinnamic acid groups, benzospiropyran, or polyethylene polymer.

For example, in the actuator provided by at least one embodiment of the present disclosure, a light emitting device comprised in the first driving unit or the second driving unit is a light emitting diode device, and the light emitting diode device comprises a flexible substrate.

For example, in the actuator provided by at least one embodiment of the present disclosure, the light emitting diode device further comprises a flexible encapsulation layer, and is attached to a surface of the photodeformation layer through the flexible encapsulation layer.

For example, in the actuator provided by at least one embodiment of the present disclosure, the first wavelength is shorter than the second wavelength.

For example, in the actuator provided by at least one embodiment of the present disclosure, the first wavelength is a blue light wavelength or an ultraviolet light wavelength, and the second wavelength is an infrared light wavelength.

At least one embodiment of the present disclosure provides a movable device, comprising an actuator according to any of the above embodiments to drive the movable device.

For example, the movable device provided by at least one embodiment of the present disclosure further comprises a controller, and the controller is configured to at least control a light emitting state of the first light emitting device in the actuator, thereby controlling the actuator to drive.

For example, the movable device provided by at least one embodiment of the present disclosure further comprises am image sensor, and the image sensor is configured to shoot an external environment of the movable device.

At least one embodiment of the present disclosure provides a manufacture method of an actuator, and the manufacture method comprises: providing a photodeformation layer; providing a first driving unit on the photodeformation layer, the first driving unit comprising at least one first light emitting device, and the first light emitting device being connected to a first side of the photodeformation layer; in which the first light emitting device is capable of emitting first light with a first wavelength, and the photodeformation layer is capable of generating a first deformation under irradiation of the first light.

For example, in the manufacture method provided by at least one embodiment of the present disclosure, the first driving unit further comprises another light emitting device; the manufacture method further comprises: connecting the another light emitting device to the first side or a second side of the photodeformation layer; the another light emitting device is capable of emitting second light with a second wavelength, and the photodeformation layer generates a second deformation under irradiation of the second light, the first wavelength is different from the second wavelength, a deformation direction of the first deformation and a deformation direction of the second deformation are opposite, and the first side and the second side of the photodeformation layer are opposite to each other.

For example, in the manufacture method provided by at least one embodiment of the present disclosure, the photodeformation layer comprises azobenzene; forming the photodeformation layer comprises: dissolving azobenzene monomers in a solvent; forming an azobenzene monomer layer on a substrate; and contacting the azobenzene monomer layer with an azobenzene crosslinking agent to allow azobenzene monomers in the azobenzene monomer layer to crosslink.

For example, in the manufacture method provided by at least one embodiment of the present disclosure, the azobenzene monomer layer is formed on the substrate by an inkjet printing method, and the azobenzene crosslinking agent is sprayed on the azobenzene monomer layer by an inkjet printing method.

At least one embodiment of the present disclosure provides an operation method of the actuator according to any one of the above embodiments, comprising: controlling the first light emitting device of the first driving unit to emit the first light with the first wavelength, to allow the photodeformation layer to generate the first deformation; and controlling the first light emitting device of the first driving unit to stop emitting light, to cause the photodeformation layer to generate a second deformation, the first deformation and the second deformation being opposite.

For example, in the operation method provided by at least one embodiment of the present disclosure, the first driving unit further comprises another light emitting device, the another light emitting device is connected to the first side or a second side of the photodeformation layer, and the first side and the second side of the photodeformation layer are opposite to each other, the operation method further comprises: controlling the another light emitting device to emit second light with a second wavelength, to allow the photodeformation layer to generate a second deformation, the first wavelength being different from the second wavelength, and a deformation direction of the first deformation and a deformation direction of the second deformation being opposite.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1A:
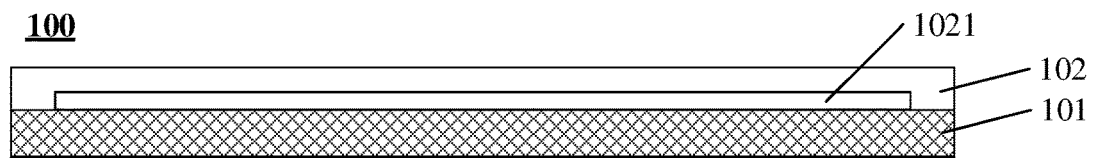
FIG. 1A is a first schematic cross-sectional view of an actuator according to some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Currently, an actuator typically includes driving elements using electrical, magnetic or mechanical structures for driving. These driving elements are usually mounted inside the actuator and have certain structures. These structures often have large volumes, thereby making it impossible for the actuator to be miniaturized, so that the actuator cannot be applied to micro robots in fields such as medical and flaw detection. In addition, it is often difficult for the actuator to generate micro motion, that is, the actuator cannot move in a small space or cannot perform a small distance motion.

At least one embodiment of the present disclosure provides an actuator, and the actuator comprises a photodeformation layer and a first driving unit; the first driving unit comprises at least one first light emitting device, the first light emitting device is connected to a first side of the photodeformation layer and is capable of emitting first light with a first wavelength to irradiate onto the photodeformation layer; the photodeformation layer is capable of generating a first deformation under irradiation of the first light.

At least one embodiment of the present disclosure provides a movable device including the above-mentioned actuator to drive the movable device to generate movement.

At least one embodiment of the present disclosure provides a manufacture method of an actuator, comprising: providing a photodeformation layer; providing a first driving unit on the photodeformation layer, the first driving unit comprising at least one first light emitting device, and the first light emitting device being connected to a first side of the photodeformation layer; in which the first light emitting device is capable of emitting first light with a first wavelength, and the photodeformation layer is capable of generating a first deformation under irradiation of the first light.

At least one embodiment of the present disclosure provides an operation method of the above-mentioned actuator, comprising: controlling the first light emitting device of the first driving unit to emit the first light with the first wavelength, to make the photodeformation layer generate the first deformation; and controlling the first light emitting device of the first driving unit to stop emitting light, to cause the photodeformation layer to generate a second deformation, and the first deformation and the second deformation are opposite.

The actuator and the manufacture method thereof, the operation method thereof, and the movable device are described through several specific embodiments below.

Figure 1B:
FIG. 1B is a schematic diagram of a deformation process of the actuator in FIG. 1A.
Figure 1C:
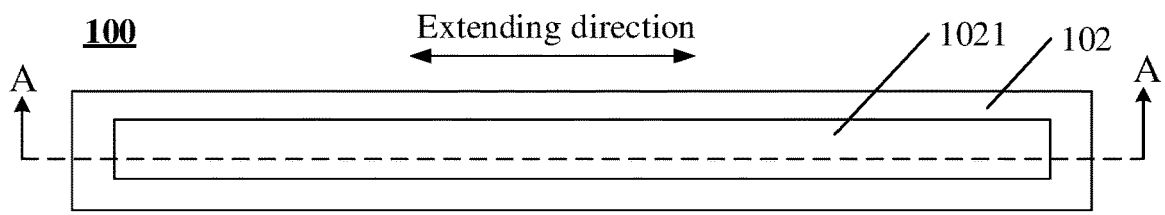
FIG. 1C is a schematic plane view of the actuator in FIG. 1A.

At least one embodiment of the present disclosure provides an actuator, FIG. 1A is a schematic cross-sectional view of the actuator, FIG. 1C is a schematic plane view of the actuator, and FIG. 1A is obtained by cutting along a line A-A in FIG. 1C. As shown in FIG. 1A, an actuator 100 comprises a photodeformation layer 101 and a first driving unit 102. The first driving unit 102 comprises at least one first light emitting device 1021, the first light emitting device 1021 is connected to a first side of the photodeformation layer 101 (an upper side of the photodeformation layer 101 shown in the figure), the first light emitting device 1021 can emit first light with a first wavelength k1 to irradiate onto the photodeformation layer 101, that is, to irradiate onto the first side of the photodeformation layer 101; the photodeformation layer 101 is capable of generating a first deformation under irradiation of the first light, which causes the actuator 100 as a whole to generate the first deformation along with the photodeformation layer 101, so that the first deformation can be used to generate a driving effect.

For example, in some embodiments, the first driving unit comprises a plurality of first light emitting devices, and each of the first light emitting devices can emit the first light with the first wavelength to irradiate onto the photodeformation layer.

For example, in some embodiments, the plurality of first light emitting devices may have the same specification. For example, geometric sizes (length, width, height) of the plurality of first light emitting devices are the same; for example, physical specifications (luminous intensity, luminous time) of the plurality of first light emitting devices are the same.

For example, in some embodiments, at least a part of the plurality of first light emitting devices have different specifications. For example, at least a part of the plurality of first light emitting devices have different geometric sizes (length, width, height); for example, at least a part of the plurality of first light emitting devices have different physical specifications (luminous intensity, luminous time), etc.

For example, a cross-sectional shape of the photodeformation layer may be a rectangle shape, a trapezoid shape, an arc-shape, or the like.

For example, in some embodiments, in a case where the first light emitting device 1021 stops irradiating the first light with the first wavelength kl, the photodeformation layer 101 is no longer irradiated by light and generates a second deformation, a deformation direction of the second deformation is opposite to a deformation direction of the first deformation (the deformation direction at least partially in a direction perpendicular to the photodeformation layer). For example, the photodeformation layer 101 can be restored to an original state (initial state) before generating the first deformation through the second deformation, so that the actuator 100 as a whole also returns to the original state along with the photodeformation layer 101 and presents a flat and straight state, and therefore the second deformation can also be used to generate a driving effect.

FIG. 1B illustrates a deformation process of the actuator 100. For example, as shown in FIG. 1B, the actuator 100 is not deformed without light irradiation, and is in a flat and straight state. In a case where the first light emitting device 1021 emits the first light with the first wavelength kl to irradiate onto the photodeformation layer 101, the actuator 100 generates the first deformation toward the side of the actuator 100 where the first light is irradiated, that is, generates the upward deformation as shown in the figure. In a case where the first light emitting device 1021 stops emitting light, the actuator 100 returns to the original state and presents the flat and straight state.

In some embodiments, in addition to the first driving unit, the actuator further comprises a second driving unit. The second driving unit comprises at least one second light emitting device, the second light emitting device is connected to a second side of the photodeformation layer (the first side and the second side of the photodeformation layer are opposite to each other), and the second light emitting device can emit second light with the first wavelength to irradiate onto the photodeformation layer. The actuator provided in these embodiments can produce bilateral deformation.

For example, in some embodiments, the second driving unit comprises a plurality of second light emitting devices, and each second light emitting device may emit second light with the first wavelength to irradiate onto the photodeformation layer.

For example, in some embodiments, the plurality of second light emitting devices may have the same specification. For example, geometric sizes (length, width, height) of the plurality of second light emitting devices are the same; for example, physical specifications (luminous intensity, luminous time) of the plurality of second light emitting devices are the same.

For example, in some embodiments, at least a part of the plurality of second light emitting devices have different specifications. For example, at least a part of the plurality of second light emitting devices have different geometric sizes (length, width, height); for example, at least a part of the plurality of second light emitting devices have different physical specifications (luminous intensity, luminous time), etc.

For example, the first light emitting device and the second light emitting device may have the same specification, or may have different specifications.

For example, in some embodiments, the first light emitting device and the second light emitting device are at least partially overlapped with each other in a direction perpendicular to the photodeformation layer.

For example, in some embodiments, the first light emitting device and the second light emitting device are not overlapped in the direction perpendicular to the photodeformation layer.

Figure 2A:
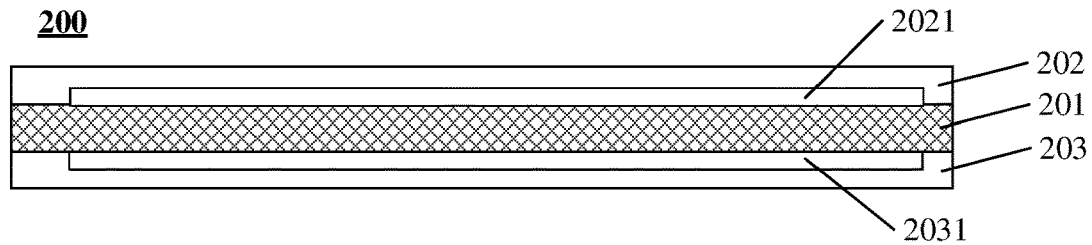
FIG. 2A is a second schematic cross-sectional view of an actuator according to some embodiments of the present disclosure.

For example, as shown in FIG. 2A, an actuator 200 comprises a photodeformation layer 201, a first driving unit 202, and a second driving unit 203. The first driving unit 202 and the second driving unit 203 are opposite to each other with the photodeformation layer 201 interposed therebetween. The first driving unit 202 comprises at least one first light emitting device 2021, and the first light emitting device 2021 is connected to a first side of the photodeformation layer 201 (an upper side of the photodeformation layer 201 as shown in the figure), the first light emitting device 2021 can emit first light with a first wavelength $\lambda 1$ to irradiate onto the first side of the photodeformation layer 201, the photodeformation layer 201 may generate a first deformation, such as an upward deformation in the embodiment shown in FIG. 2A, under the irradiation of the first light of the first light emitting device 2021. The second driving unit 203 comprises at least one second light emitting device 2031, and the second light emitting device 2031 is connected to a second side of the photodeformation layer 201 (a lower side of the photodeformation layer 201 as shown in the figure) and is opposite to the first light emitting device 2021. The second light emitting device 2031 may also emit second light with the first wavelength $\lambda 1$ to irradiate onto the second side of the photodeformation layer 201, the photodeformation layer 201 may generate another deformation under the irradiation of the second light of the second light emitting device 2031, a deformation direction of the another deformation is opposite to a deformation direction of the first deformation, and for example, the another deformation is a downward deformation in the embodiment shown in FIG. 2A. Therefore, the actuator 200 provided in the embodiment can generate bilateral deformation along with the photodeformation layer 201.

Figure 2B:
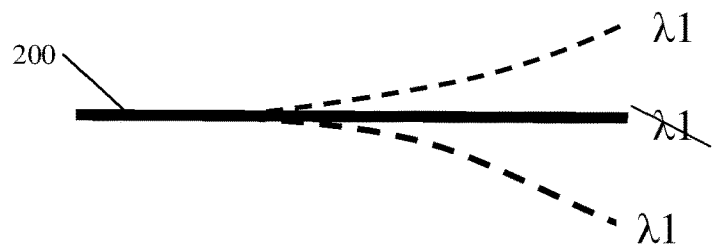
FIG. 2B is a schematic diagram of a deformation process of the actuator in FIG. 2A.

FIG. 2B illustrates a deformation process of the actuator 200. For example, as shown in FIG. 2B, the actuator 200 does not generate a deformation without light irradiation, and is in a flat and straight state. In a case where the first light emitting device 2021 emits the first light with the first wavelength $\lambda 1$ to irradiate onto the photodeformation layer 201, the actuator 200 generates a deformation toward the side of the actuator 200 where the first light is irradiated, that is, generates the upward deformation as shown in the figure. In a case where the first light emitting device 2021 stops emitting light, the actuator 200 returns to the original state, that is, presenting the flat and straight state. In a case where the second light emitting device 2031 emits the second light with the first wavelength $\lambda 1$ to irradiate onto the photodeformation layer 201, the actuator 200 generates a deformation toward the side where the second light is irradiated, that is, generates a downward deformation as shown in the figure. In a case where the second light emitting device 2031 stops emitting light, the actuator 200 returns to the original state and presents the flat and straight state. Therefore, the actuator 200 can be deformed on both sides, so that the movement mode of the actuator 200 is diversified. For example, in the embodiments, the driving effects may be symmetrical with respect to an extending direction (a horizontal direction in the figure) of the actuator 200.

In some embodiments, the first driving unit comprises at least one third light emitting device in addition to the first light emitting device, the third light emitting device is connected to the first side of the photodeformation layer, and can emit third light with a second wavelength to irradiate onto the photodeformation layer; the first wavelength and the second wavelength are different, and the deformed photodeformation layer generates a second deformation under the irradiation of the third light with the second wavelength, and a deformation direction of the first deformation and a deformation direction of the second deformation are opposite. In the embodiment, the deformed photodeformation layer can be restored or be quickly restored to the original state under the irradiation of the third light with the second wavelength.

For example, in some embodiments, the first driving unit comprises a plurality of third light emitting devices, and each third light emitting device can emit the third light with the second wavelength to irradiate onto the photodeformation layer.

For example, in some embodiments, the plurality of third light emitting devices may have the same specification. For example, geometric sizes (length, width, height) of the plurality of third light emitting devices are the same; for example, physical specifications (luminous intensity, luminous time) of the plurality of third light emitting devices are the same.

For example, in some embodiments, at least a part of the plurality of third light emitting devices have different specifications. For example, at least a part of the plurality of third light emitting devices have different geometric sizes (length, width, height); for example, at least a part of the plurality of third light emitting devices have different physical specifications (luminous intensity, luminous time), etc.

For example, the first light emitting device and the third light emitting device may have the same specification, or may have different specifications.

Figure 3A:
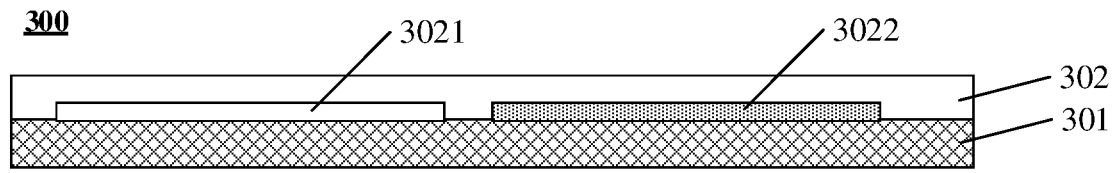
FIG. 3A is a third schematic cross-sectional view of an actuator according to some embodiments of the present disclosure.

For example, as shown in FIG. 3A, an actuator 300 comprises a photodeformation layer 301 and a first driving unit 302. The first driving unit 302 comprises at least one first light emitting device 3021 and at least one third light emitting device 3022, and the first light emitting device 3021 and the third light emitting device 3022 are arranged in parallel with each other. The first light emitting device 3021 is connected to a first side of the photodeformation layer 301 (an upper side of the photodeformation layer 301 as shown in the figure), the first light emitting device 3021 may emit first light with a first wavelength $\lambda 1$ to irradiate onto the first side of the photodeformation layer 301, and the photodeformation layer 301 may generate a first deformation under the irradiation of the first light of the first light emitting device 3021. The third light emitting device 3022 is connected to the first side of the photodeformation layer 301, and can emit third light with a second wavelength $\lambda 2$ to irradiate onto the first side of the photodeformation layer 301. Because of a dispersion property of a light source such as a point light source or a line light source, although the first light emitting device 3021 and the third light emitting device 3022 are disposed at different positions of the photodeformation layer 301, the light emitted by the first light emitting device 3021 and the light emitted by the third light emitting device 3022 can be irradiated to substantially the same positions of the photodeformation layer 301, or a light irradiation area of the first light emitting device 3021 and a light irradiation area of the third light emitting device 3022 may be mostly overlapped with each other; alternatively, in at least one example, the first light emitting device 3021 and the third light emitting device 3022 may be slightly inclined with respect to a surface of the first side of the photodeformation layer 301, so that the light irradiation areas of the first light emitting device 3021 and the third light emitting device 3022 are overlapped with each other. In this case, the photodeformation layer 301, which generates the first deformation, may generate a second deformation under the irradiation of the third light with the second wavelength $\lambda 2$, and the deformation direction of the first deformation and the deformation direction of the second deformation are opposite. For example, the deformed photodeformation layer 301 can generate an inversion deformation of the first deformation under the irradiation of the third light with the second wavelength $\lambda 2$, so that the photodeformation layer 301 can be restored to the original state, thereby generating a driving effect. For example, in the embodiments, the deformed actuator 300 can be quickly restored to the original state under the irradiation of the third light with the second wavelength $\lambda 2$, thereby increasing the deformation speed of the actuator 300.

Figure 3B:
FIG. 3B is a schematic diagram of a deformation process of the actuator in FIG. 3A.

FIG. 3B illustrates a deformation process of the actuator 300. For example, as shown in FIG. 3B, the actuator 300 is not deformed without light irradiation, and is in a flat and straight state. In a case where the first light emitting device 3021 emits the first light with the first wavelength $\lambda 1$ to irradiate onto the photodeformation layer 301, the actuator 300 generates a deformation toward the side of the actuator 200 where the first light is irradiated, that is, generates the upward deformation as shown in the figure. In a case where the first light emitting device 3021 stops emitting light, and the third light emitting device 3022 emits the third light with the second wavelength $\lambda 2$ to irradiate onto the first side of the photodeformation layer 301, the actuator 300 generates a second deformation, and a deformation direction of the second deformation is opposite to the deformation direction of the first deformation, for example, the second deformation can allow the actuator 300 to be restored to the original state from the first deformation, so that the actuator 300 presents the flat and straight state, thereby generating a driving effect. For example, in the embodiments, the third light with the second wavelength $\lambda 2$ can accelerate the actuator 300 to return to the original state compared to no light irradiation.

In some embodiments, the actuator comprises a first driving unit and a second driving unit, the first driving unit comprises at least one first light emitting device and at least one third light emitting device, the second driving unit comprises at least one second light emitting device and at least one fourth light emitting device, the second light emitting device and the fourth light emitting device are connected to a second side of the photodeformation layer (the first side and the second side of the photodeformation layer are opposite to each other), the second light emitting device may emit second light with a first wavelength to irradiate onto the photodeformation layer, and the fourth light emitting device may emit fourth light with a second wavelength to irradiate onto the photodeformation layer.

For example, in some embodiments, the second driving unit comprises a plurality of fourth light emitting devices, and each fourth light emitting device may emit the fourth light with the second wavelength to irradiate onto the photodeformation layer.

For example, in some embodiments, the plurality of fourth light emitting devices may have the same specification. For example, geometric sizes (length, width, height) of the plurality of fourth light emitting devices are the same; for example, physical specifications (luminous intensity, luminous time) of the plurality of fourth light emitting devices are the same.

For example, in some embodiments, at least a part of the plurality of fourth light emitting devices have different specifications. For example, at least a part of the plurality of fourth light emitting devices have different geometric sizes (length, width, height); for example, at least a part of the plurality of fourth light emitting devices have different physical specifications (luminous intensity, luminous time), etc.

For example, the second light emitting device and the fourth light emitting device may have the same specification, or may have different specifications.

For example, in some embodiments, the third light emitting device and the fourth light emitting device are at least partially overlapped with each other in a direction perpendicular to the photodeformation layer.

For example, in some embodiments, the third light emitting device and the fourth light emitting device are not overlapped in the direction perpendicular to the photodeformation layer.

Figure 4A:
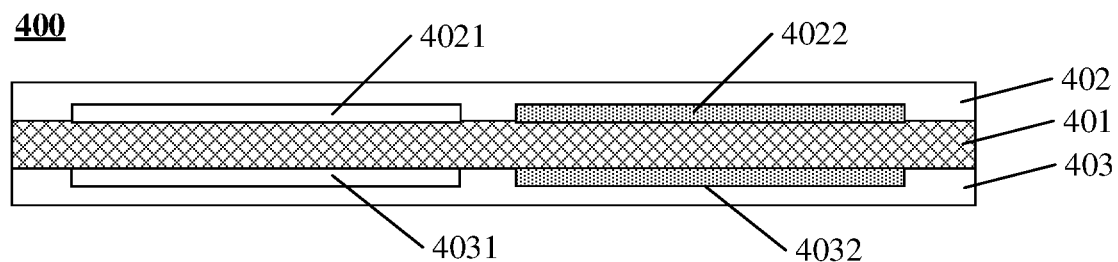
FIG. 4A is a fourth schematic cross-sectional view of an actuator according to some embodiments of the present disclosure.

For example, as shown in FIG. 4A, an actuator 400 comprises a photodeformation layer 401, a first driving unit 402, and a second driving unit 403. The first driving unit 402 and the second driving unit 403 are opposite to each other with the photodeformation layer 401 interposed therebetween.

The first driving unit 402 comprises at least one first light emitting device 4021 and at least one third light emitting device 4023. The first light emitting device 4021 and the third light emitting device 4023 are connected to a first side of the photodeformation layer 401 (an upper side of the photodeformation layer 401 as shown in the figure), the first light emitting device 4021 can emit first light with a first wavelength λ1 to irradiate onto the first side of the photodeformation layer 201, the photodeformation layer 401 may generate a first deformation under the irradiation of the first light of the first light emitting device 4021. The third light emitting device 4022 may emit third light with the second wavelength λ2 to irradiate onto the photodeformation layer 401; the deformed photodeformation layer 401 generates a second deformation under the irradiation of the third light with the second wavelength λ2, and a deformation direction of the first deformation and a deformation direction of the second deformation are opposite.

The second driving unit 403 comprises at least one second light emitting device 4031 and at least one fourth light emitting device 4032. The second light emitting device 4031 and the fourth light emitting device 4032 are connected to a second side of the photodeformation layer 401 (a lower side of the photodeformation layer 401 as shown in the figure). The second light emitting device 4031 may emit second light with the first wavelength λ1 to irradiate onto the photodeformation layer 401, the photodeformation layer 401 may generate a third deformation under the irradiation of the second light with the first wavelength λ1. The fourth light emitting device may emit fourth light with the second wavelength λ2 to irradiate onto the photodeformation layer 401. The deformed photodeformation layer 401 generates a fourth deformation under the irradiation of the fourth light with the second wavelength λ2, and a deformation direction of the fourth deformation and a deformation direction of the third deformation are opposite.

In the embodiments, the photodeformation layer 401 of the actuator 400 can be deformed oppositely under the driving of the first driving unit 402 and the second driving unit 403, thereby generating a driving effect, and the actuator 400 can quickly return to the original state after being deformed.

Figure 4B:
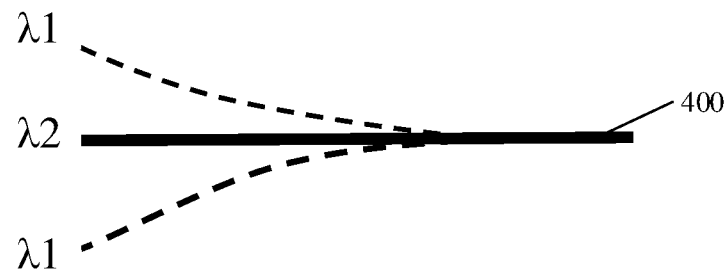
FIG. 4B is a schematic diagram of a deformation process of the actuator in FIG. 4A.

FIG. 4B illustrates a deformation process of the actuator 400. For example, as shown in FIG. 4B, the actuator 400 does not generate the deformation without light irradiation, and is in a flat and straight state.

In a case where the first light emitting device 4021 emits the first light with the first wavelength λ1 to irradiate onto the photodeformation layer 401, the actuator 400 generates the first deformation toward the side of the actuator 200 where the first light is irradiated, that is, generates the upward deformation as shown in the figure. In a case where the first light emitting device 4021 stops emitting light, and the third light emitting device 4022 emits the third light with the second wavelength λ2 to irradiate onto the first side of the photodeformation layer 401, the actuator 400 generates a second deformation, and a deformation direction of the second deformation is opposite to the deformation direction of the first deformation, for example, the second deformation can allow the actuator 400 to be restored to the original state from the first deformation, so that the actuator 400 presents the flat and straight state.

In a case where the third light emitting device 4031 emits the third light with the first wavelength λ1 to irradiate onto the photodeformation layer 401, the actuator 400 generates a third deformation toward the side of the photodeformation layer 401 where the third light is irradiated, that is, generates the downward deformation as shown in the figure. In a case where the third light emitting device 4031 stops emitting light, and the fourth light emitting device 4032 emits the fourth light with the second wavelength λ2 to irradiate onto the photodeformation layer 401, the actuator 400 generates a fourth deformation, and a deformation direction of the fourth deformation is opposite to the deformation direction of the third deformation, for example, the fourth deformation can allow the actuator 400 to be restored to the original state from the third deformation, so that the actuator 400 presents the flat and straight state. In this way, the generated driving effects can be symmetrical with respect to the extending direction (horizontal direction in the figure) of the actuator 400.

Figure 5:
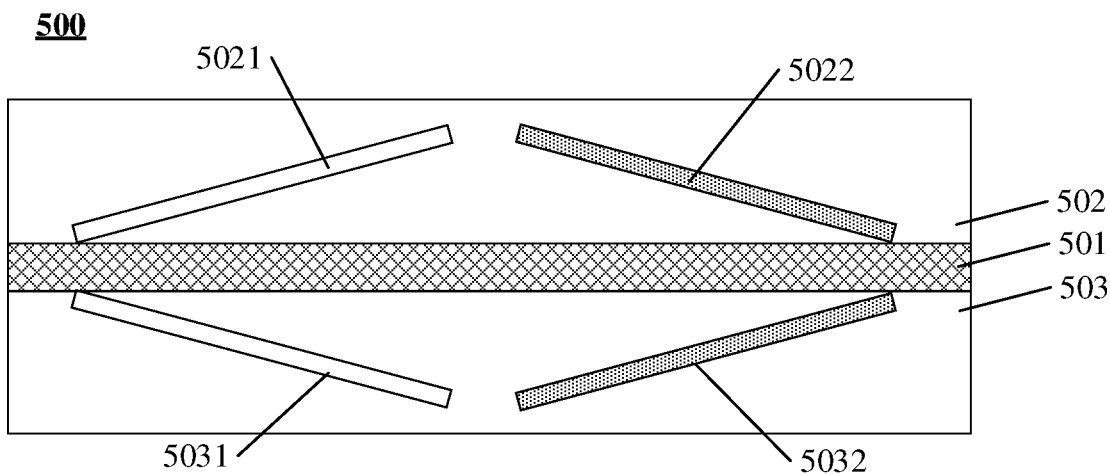
FIG. 5 is a fifth schematic cross-sectional view of an actuator according to some embodiments of the present disclosure.

In at least one example, as shown in FIG. 5, the first light emitting device 5021 and the third light emitting device 5022 included in the first driving unit 502 of an actuator 500 may be disposed obliquely, so that the light emitted by the first light emitting device 5021 and the light emitted by the third light emitting device 5022 can be substantially irradiated onto the same portions of the photodeformation layer 501 to accelerate the returning process of the deformed actuator 500. For another example, the second light emitting device 5031 and the fourth light emitting device 5032 included in the second driving unit 503 may also be disposed obliquely, so that the light emitted by the second light emitting device 5031 and the light emitted by the fourth light emitting device 5032 can be substantially irradiated onto the same portions of the photodeformation layer 501 to accelerate the returning process of the photodeformation layer 501.

In the above examples, the deformation process of the actuator 500 is substantially the same as that of the actuator 400, and details are not described herein again.

In at least one embodiment, the first driving unit comprises a plurality of first light emitting devices and a plurality of third light emitting devices, and the second driving unit comprises a plurality of second light emitting devices and a plurality of fourth light emitting devices; in a direction parallel to an extending direction of the photodeformation layer, the first light emitting devices are interlaced with the third light emitting devices, and the second light emitting devices are interlaced with the fourth light emitting devices.

Figure 6A:
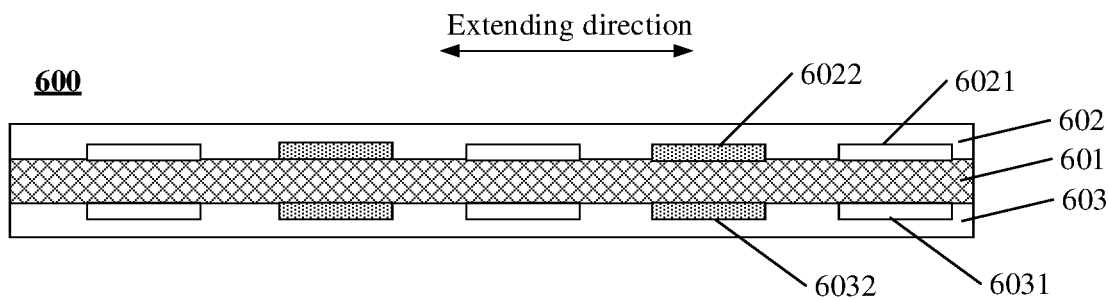
FIG. 6A is a sixth schematic cross-sectional view of an actuator according to some embodiments of the present disclosure.

For example, in some embodiments, as shown in FIG. 6A, in an actuator 600, the first driving unit 602 comprises a plurality of first light emitting devices 6021 and a plurality of third light emitting devices 6022, the plurality of first light emitting devices 6021 are interlaced with the plurality of third light emitting devices 6022, the second driving unit 603 comprises a plurality of second light emitting devices 6031 and a plurality of fourth light emitting devices 6032, and the plurality of second light emitting devices 6031 are interlaced with the plurality of fourth light emitting devices 6032. In a direction perpendicular to a layer surface of the photodeformation layer 601, the first light emitting device 6021 and the second light emitting device 6031 are overlapped with each other, and the third light emitting device 6022 and the fourth light emitting device 6032 are overlapped with each other. In these embodiments, the actuator 600 may perform a plurality of sub-movements along with the photodeformation layer 601, thereby generating a motion state similar to the flagella wriggle.

For example, in some embodiments, the plurality of first light emitting devices 6021 and the plurality of third light emitting devices 6022, which are interlaced with the plurality of first light emitting devices 6021, are uniformly distributed.

For example, in some embodiments, the plurality of second light emitting devices 6031 and the plurality of fourth light emitting devices 6032, which are interlaced with the plurality of second light emitting devices 6031, are uniformly distributed.

For example, in some embodiments, a pitch between a first light emitting device 6021 and a third light emitting device 6022, which are adjacent, is the same as a pitch between a second light emitting device 6031 and a fourth light emitting device 6032, which are adjacent.

Figure 6B:
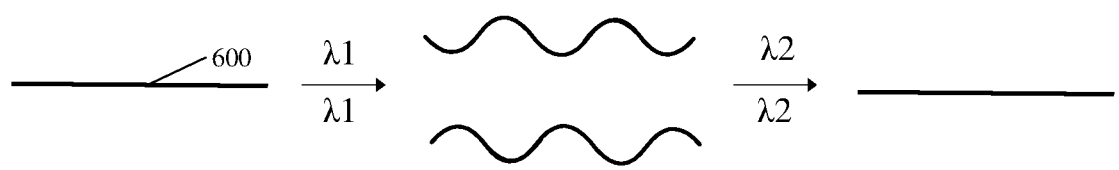
FIG. 6B is a schematic diagram of a deformation process of the actuator in FIG. 6A.

FIG. 6B illustrates a deformation process of the actuator 600. For example, as shown in FIG. 6B, the actuator 600 is not deformed without light irradiation, and is in a flat and straight state. For example, in a case where the plurality of first light emitting devices 6021 of the first driving unit 602 emit the first light with the first wavelength λ1, the actuator 600 may generate, for example, a "first wave shape" deformation shown above in FIG. 6B. In a case where the first light emitting devices 6021 stop emitting light, and the plurality of third light emitting devices 6022 of the first driving unit 602 emit third light with the second wavelength 2, the actuator 600 returns to the original state and presents the flat and straight state. For example, in a case where the plurality of second light emitting devices 6031 of the second driving unit 603 emit the second light with the first wavelength λ1, the actuator 600 may generate, for example, a "second wave shape" deformation shown below in FIG. 6B, and a shape of the "second wave shape" is opposite to a shape of the "first wave shape". In a case where the second light emitting devices 6031 stop emitting light, and the plurality of fourth light emitting devices 6032 of the second driving unit 603 emit the fourth light with the second wavelength 2, the actuator 600 returns to the original state and presents the flat and straight state, thereby generating a driving effect. In this case, the actuator 600 may generate a motion state similar to the flagella wriggle.

Figure 7A:
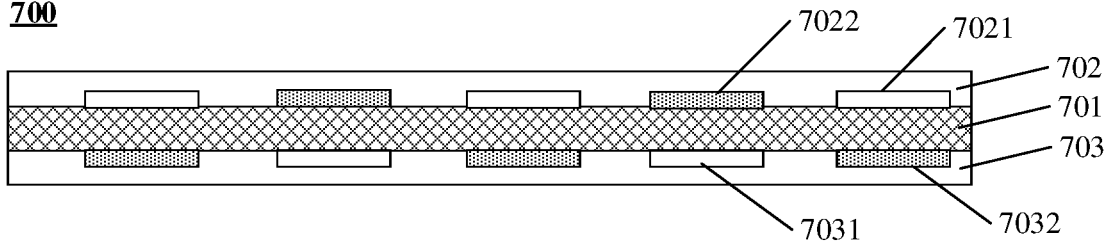
FIG. 7A is a seventh schematic cross-sectional view of an actuator according to some embodiments of the present disclosure.

For example, in some embodiments, as shown in FIG. 7A, in an actuator 700, the first driving unit 702 comprises a plurality of first light emitting devices 7021 and a plurality of third light emitting devices 7022, the plurality of first light emitting devices 7021 are interlaced with the plurality of third light emitting devices 7022, the second driving unit 703 comprises a plurality of second light emitting devices 7031 and a plurality of fourth light emitting devices 7032, and the plurality of second light emitting devices 7031 are interlaced with the plurality of fourth light emitting devices 7032. In a direction perpendicular to a layer surface of the photodeformation layer 701, the first light emitting device 7021 and the second light emitting device 7031 are overlapped with each other, and the third light emitting device 7022 and the fourth light emitting device 7032 are overlapped with each other.

For example, in some embodiments, the plurality of first light emitting devices 7021 and the plurality of third light emitting devices 7022, which are interlaced with the plurality of first light emitting devices 7021, are uniformly distributed.

For example, in some embodiments, the plurality of second light emitting devices 7031 and the plurality of fourth light emitting devices 7032, which are interlaced with the plurality of second light emitting devices 7031, are uniformly distributed.

For example, in some embodiments, a pitch between a first light emitting device 7021 and a third light emitting device 7022, which are adjacent, is the same as a pitch between a second light emitting device 7031 and a fourth light emitting device 7032, which are adjacent.

Figure 7B:
FIG. 7B is a schematic diagram of a deformation process of the actuator in FIG. 7A.

FIG. 7B illustrates a deformation process of the actuator 600. For example, as shown in FIG. 7B, the actuator 700 is not deformed without light irradiation, and is in a flat and straight state. For example, in a case where the plurality of first light emitting devices 7021 of the first driving unit 702 emit the first light with the first wavelength λ1, and the plurality of second light emitting devices 7031 of the second driving unit 703 emit the second light with the first wavelength λ1, the actuator 700 may generate, for example, a "third wave shape" deformation shown in FIG. 7B. In a case where the first light emitting devices 7021 and the second light emitting devices 7031 stop emitting light, the plurality of third light emitting devices 7022 of the first driving unit 702 emit third light with the second wavelength λ2, and the plurality of fourth light emitting devices 7032 of the second driving unit 703 emit fourth light with the second wavelength λ2, the actuator 600 returns to the original state and presents the flat and straight state, thereby generating a driving effect.

In this embodiment, the actuator 700 can also generate a motion state similar to the flagella wriggle. In addition, in the actuator 700, light emitting devices, which are disposed oppositely, can respectively emit light with a first wavelength λ1 and light with a second wavelength λ2 to irradiate onto the same portions of the photodeformation layer 701, and therefore the above arrangements can allow the light emitting devices to control the deformation of the photodeformation layer 701 more sensitively, and further control the motion state of the actuator 700 more sensitively.

Figure 8A:
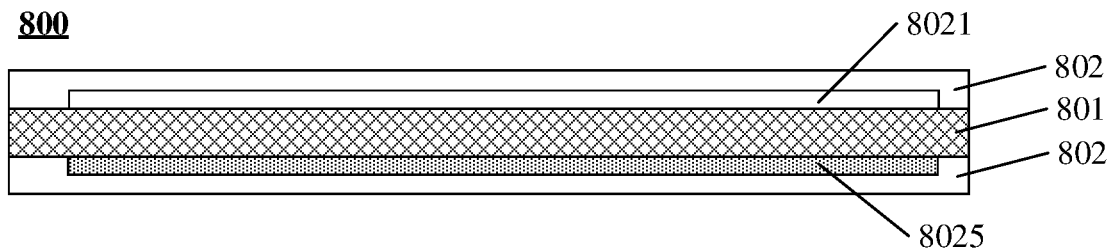
FIG. 8A is an eighth schematic cross-sectional view of an actuator according to some embodiments of the present disclosure.

In some embodiments, the first driving unit may comprise oppositely disposed light emitting devices that emit different light. For example, as shown in FIG. 8A, in an actuator 800, the first driving unit 802 comprises at least one first light emitting device 8021 and at least one fifth light emitting device 8025. The first light emitting device 8021 is connected to a first side of the photodeformation layer 801 (an upper side of the photodeformation layer 801 show in the figure), the first light emitting device 8021 can emit first light with a first wavelength $\lambda 1$ to irradiate onto the first side of the photodeformation layer 801, and the fifth light emitting device 8025 is connected to a second side of the photodeformation layer 801 (a lower side of the photodeformation layer 801 shown in the figure) and can emit fifth light with a second wavelength $\lambda 2$ to irradiate onto the photodeformation layer 801.

Figure 8B:
FIG. 8B is a schematic diagram of a deformation process of the actuator in FIG. 8A.

As shown in FIG. 8B, the photodeformation layer 801 generates a first deformation, that is, the upward deformation shown in the figure, under the irradiation of the first light with the first wavelength $\lambda 1$. The photodeformation layer 801 generates a second deformation under the irradiation of the fifth light with the second wavelength $\lambda 2$, and a deformation direction of the first deformation and a deformation direction of the second deformation are opposite. For example, the photodeformation layer 801, which has generated the first deformation, returns to the original state under the irradiation of the fifth light with the second wavelength $\lambda 2$, and presents a flat and straight state, thereby generating a driving effect. In the actuator 800, the light emitting devices disposed oppositely can respectively emit light with the first wavelength $\lambda 1$ and light with the second wavelength $\lambda 2$ to irradiate onto substantially the same portions of the photodeformation layer 801, and therefore the above arrangements can allow the light emitting devices to control the deformation of the photodeformation layer 801 more sensitively, and further control the motion state of the actuator 800 more sensitively.

Figure 9A:
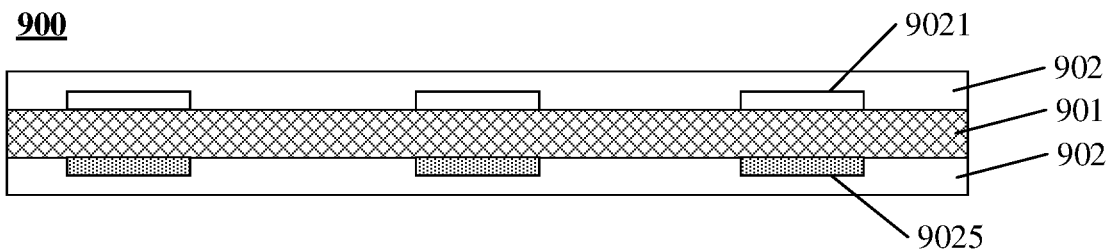
FIG. 9A is a ninth schematic cross-sectional view of an actuator according to some embodiments of the present disclosure.

In some embodiments, as shown in FIG. 9A, in an actuator 900, the first driving unit 902 comprises a plurality of first light emitting devices 9021 and a plurality of fifth light emitting devices 9025. The plurality of first light emitting devices 9021 are connected to a first side of the photodeformation layer 901 (an upper side of the photodeformation layer 901 shown in the figure), the first light emitting device 9021 can emit first light with a first wavelength $\lambda 1$ to irradiate onto the first side of the photodeformation layer 901, the plurality of fifth light emitting devices 9025 are connected to a second side of the photodeformation layer 901 (a lower side of the photodeformation layer 901 shown in the figure), the fifth light emitting device 9025 can emit fifth light with a second wavelength $\lambda 2$ to irradiate onto the second side of the photodeformation layer 901. For example, the first light emitting device 9021 and the fifth light emitting device 9025 are overlapped with each other in a direction perpendicular to a layer surface of the photodeformation layer 901.

Figure 9B:
FIG. 9B is a schematic diagram of a deformation process of the actuator in FIG. 9A.

As shown in FIG. 9B, in a case that the plurality of first light emitting devices 9021 emit the first light with the first wavelength $\lambda 1$, the actuator 900 generates a plurality of first sub-deformations to form a "fourth wave shape" deformation as shown in FIG. 9B, in a case that the plurality of fifth light emitting devices 9025 emit the fifth light with the second wavelength $\lambda 2$, the actuator 900 generates a plurality of second sub-deformations, and a deformation direction of the first sub-deformation and a deformation direction of the second sub-deformation are opposite. For example, the actuator 900 that has generated the "fourth wave shape" deformation returns to the original state under the irradiation of the fifth light with the second wavelength $\lambda 2$ and presents a flat and straight state, thereby generating a driving effect.

Figure 10A:
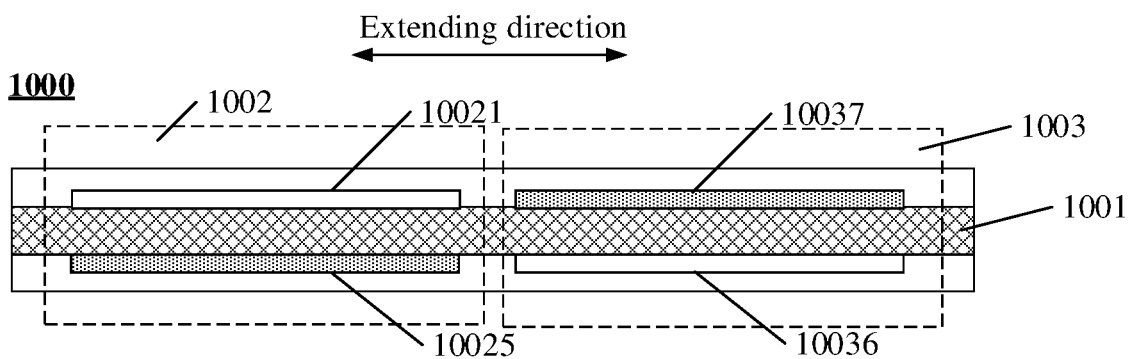
FIG. 10A is a tenth schematic cross-sectional view of an actuator according to some embodiments of the present disclosure.

In some embodiments, as shown in FIG. 10A, an actuator 1000 comprises a photodeformation layer 1001, a first driving unit 1002, and a second driving unit 1003. The first driving unit 1002 and the second driving unit 1003 are arranged in parallel along an extending direction (a horizontal direction in the figure) of the photodeformation layer 1001.

The first driving unit 1002 comprises at least one first light emitting device 10021 and at least one fifth light emitting device 10025. The first light emitting device 10021 is connected to a first side of the photodeformation layer 1001 (an upper side of the photodeformation layer 1001 shown in the figure), the first light emitting device 10021 can emit first light with a first wavelength $\lambda 1$ to irradiate onto the first side of the photodeformation layer 1001, the plurality of fifth light emitting devices 10025 are connected to a second side of the photodeformation layer 1001 (a lower side of the photodeformation layer 1001 shown in the figure), and the fifth light emitting device 10025 can emit fifth light with a second wavelength $\lambda 2$ to irradiate onto the second side of the photodeformation layer 1001.

The second driving unit 1003 comprises at least one sixth light emitting device 10036 and at least one seventh light emitting device 10037. The sixth light emitting device 10036 is connected to a second side of the photodeformation layer 1001, and can emit sixth light with the first wavelength $\lambda 1$ to irradiate onto the second side of the photodeformation layer 1001, the seventh light emitting device 10037 is connected to the first side of the photodeformation layer 1001, and can emit seventh light with the second wavelength $\lambda 2$ and irradiate the seventh light onto the first side of the photodeformation layer 1001. For example, the sixth light emitting device 10036 and the seventh light emitting device 10037 are overlapped with each other in a direction perpendicular to a layer surface of the photodeformation layer 1001.

Figure 10B:
FIG. 10B is a schematic diagram of a deformation process of the actuator in FIG. 10A.

As shown in FIG. 10B, the actuator 1000 generates a first deformation in a case where the first light emitting device 10021 emits the first light with the first wavelength $\lambda 1$ and the sixth light emitting device 10036 emits the sixth light with the first wavelength $\lambda 1$, so as to form a "fifth wave shape" deformation as shown in FIG. 10B, the actuator 1000 generates a second deformation in a case where the fifth light emitting device 10025 emits the fifth light with the second wavelength $\lambda 2$ and the seventh light emitting device 10037 emits the seventh light with the second wavelength $\lambda 2$, a deformation direction of the first deformation and a deformation direction of the second deformation are opposite. For example, the actuator 1000 that has generated the "fifth wave shape" deformation returns to the original state under the irradiation of the fifth light and the seventh light with the second wavelength $\lambda 2$ and presents a flat and straight state, thereby generating a driving effect.

For example, in any one of the above embodiments, a material of the photodeformation layer comprises azobenzene, triphenylmethane derivatives, copolymers containing cinnamic acid groups, benzospiropyran, polyethylene polymers, or the like, or a combination of these materials. These materials will produce different deformation under different light, thereby achieving the effect of photodeformation.

For example, in any one of the above embodiments, the first wavelength is different from the second wavelength, for example, the first wavelength is shorter than the second wavelength; in addition, the first wavelength and the second wavelength may be a specific wavelength value or a wavelength range. For example, the first wavelength is a blue light wavelength or an ultraviolet light wavelength, and the second wavelength is an infrared light wavelength. In this case, the photodeformation layer can be deformed and restored under the irradiation of light with the first wavelength and the irradiation of light with the second wavelength, respectively.

For example, some photodeformation materials containing azobenzene are irradiated by light with such as a blue wavelength or an ultraviolet wavelength, the azobenzene undergoes cis-trans isomerism, a surface, which is irradiated, of the material will shrink, so that the material will bend to the side irradiated by light; and for example, azobenzene undergoes a reverse reaction in a case that the deformed material is not irradiate by light or under the irradiation of light with an infrared wavelength, in this case, the shrinking surface of the material will expand, so that the bending deformation will return to the original state.

For example, some photodeformation materials containing triphenylmethane derivatives will expand under the irradiation of light with such as an ultraviolet wavelength, so that the materials are deformed. After the irradiation of the light with the ultraviolet wavelength is removed, the expansion is restored, and the materials are restored to the original state.

For example, under the irradiation of light with a wavelength greater than 260 nm, cross-linked structures of some copolymers containing cinnamic acid groups change, resulting in deformation of the entire materials. On the contrary, under the irradiation of light with a wavelength less than 260 nm, the cross-linked structures of the copolymers will return to the original form, and the entire materials will return to the original state.

For example, some photodeformation materials containing benzospiropyran will stretch under the irradiation of light with such as an ultraviolet wavelength, so that the materials are deformed; after the irradiation of light with the ultraviolet wavelength is removed, the stretch will be restored, and the materials return to the original state.

For example, some photodeformation materials containing polyethylene polymers have shape memory, and will generate a certain deformation under the irradiation of light with such as an ultraviolet wavelength. After the irradiation of light with the ultraviolet wavelength is removed, the photodeformation materials return to the original state.

In the embodiments of the present disclosure, the material of the photodeformation layer is not limited to the above examples, and may comprise other photodeformation materials. According to different deformation principles of different materials, the first wavelength and the second wavelength may also choose other wavelengths, and the embodiments of the present disclosure are not limited thereto.

For example, in any one of the above embodiments, the light emitting device included in the first driving unit and/or the second driving unit may be a light emitting diode device, such as an organic light emitting diode (OLED) device, a quantum dot light emitting diode (QLED) device, or a micro light emitting diode (MicroLED) device, a sub-millimeter light emitting diodes (Mini LED), etc. For example, the light emitting diode device comprises a flexible substrate, for example, an OLED is directly formed on the flexible substrate, and the inorganic LED can be attached and mounted on the flexible substrate by a transfer method or the like. For example, a material of the flexible substrate is a transparent material, such as organic materials such as polyimide, polycarbonate, polyethersulfone, polyethylene terephthalate, or the like. For example, the light emitting diode device further comprises a flexible encapsulation layer, and the light emitting diode device is attached to a surface of the photodeformation layer through the flexible encapsulation layer. For example, a material of the flexible encapsulation layer is also a transparent material, such as inorganic materials such as SiNX, SiCN, or organic materials such as polyimide, polycarbonate, polyethersulfone, polyethylene terephthalate, or the like. Therefore, the light emitting diode device as a whole has flexibility, and can better match the deformation of the photodeformation layer.

Figure 11:
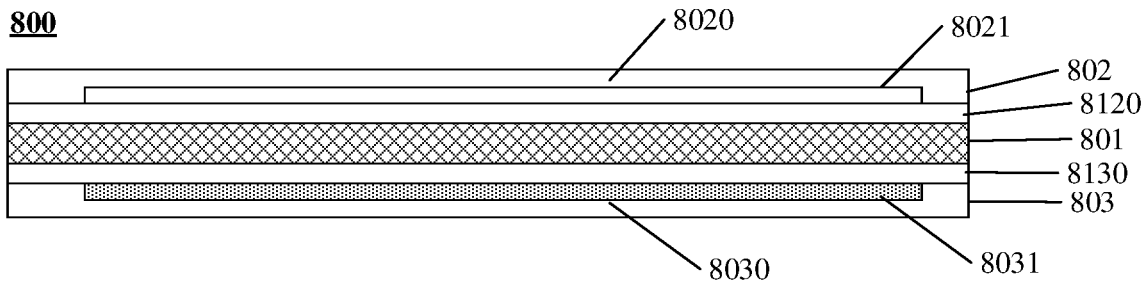
FIG. 11 is a eleventh schematic cross-sectional view of an actuator according to some embodiments of the present disclosure.

For example, the present disclosure is exemplarily described by taking the light emitting diode device having the above-mentioned structure being applied to the actuator 800 as shown in FIG. 8A as an example. As shown in FIG. 11, the first light emitting device 8021 of the first driving unit 802 comprises a flexible substrate 8020 and a flexible encapsulation layer 8120, the first light emitting device 8021 is attached to the first side of the photodeformation layer 801 through the flexible encapsulation layer 8120. The second light emitting device 8031 of the first driving unit 803 comprises a flexible substrate 8030 and a flexible encapsulation layer 8130. The second light emitting device 8031 is attached to the second side of the photodeformation layer 801 through the flexible encapsulation layer 8130. Therefore, the actuator 800 as a whole has flexibility, so that the movement of the actuator 800 is more flexible.

The actuator provided by the embodiments of the present disclosure comprises a light emitting device combined with the photodeformation layer, the actuator controls the light emitting device to emit light or not or to emit different light to control the deformation state of the photodeformation layer, thereby generating a driving effect to achieve the movement of the actuator. The light emitting device is flexible and has a small size, which can achieve the miniaturization of the actuator and can more flexibly control the movement state of the actuator, thereby achieving the micro movement of the actuator, for example, the actuator can move in a small space or perform a small distance movement.

Figure 12:
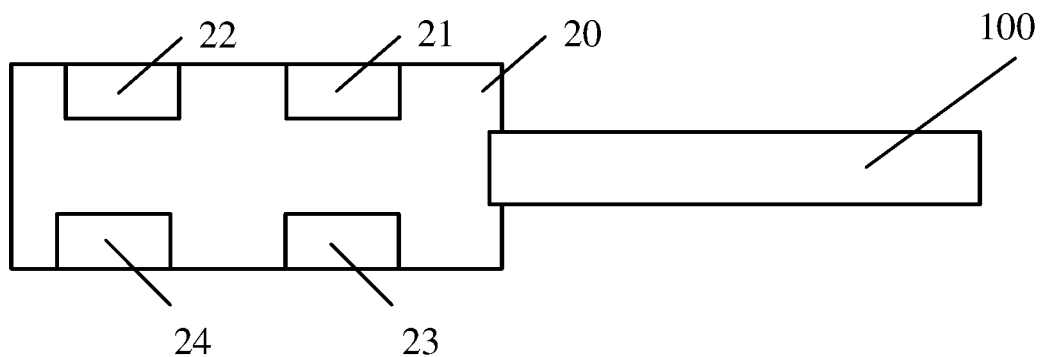
FIG. 12 is a schematic diagram of a movable device according to some embodiments of the present disclosure.

At least one embodiment of the present disclosure provides a movable device. As shown in FIG. 12, the movable device 20 comprises at least one actuator (the actuator 100 illustrated in the figure) provided in the embodiments of the present disclosure to drive the movable device 20. The movable device 20 can move under the driving of the actuator 100.

For example, the movable device 20 may further comprise a controller 21, and the controller 20 may at least control a light emitting state of the first light emitting device in the actuator 100, thereby controlling the actuator 100 to drive. For example, in a case where the actuator 100 comprises other light emitting devices, such as a second light emitting device or/and a third light emitting device or/and a fourth light emitting device, etc., the controller 21 can also control, for example, light emitting states of these light emitting devices, thereby flexibly controlling the movement of the movable device 20.

For example, the light emitting state comprises whether each light emitting device emits light, and comprises luminous intensity, luminous time, luminous order, and the like of each light emitting device.

For example, in some embodiments, the controller 21 may be any control unit having data processing capability and/or program execution capability, such as a central processing unit (CPU), a digital signal processor (DSP), a single-chip microcomputer, or the like. For example, the controller 21 may further comprise a storage unit, and the storage unit stores control programs of the light emitting devices of the movable device 20 in different motion modes, and the like. For example, the storage unit may be any form of storage medium, such as a volatile memory or a non-volatile memory, such as a semiconductor memory or a magnetic medium memory.

For example, in some embodiments, the movable device 20 further comprises an image sensor 22, and the image sensor 22 is configured to shoot the external environment of the movable device 20. For example, during a movement process of the movable device 20, the image sensor 22 may be used to capture the surrounding environment of the movable device 20 during the movement process. For example, the image sensor 22 may be sensors of any form, such as a CCD image sensor, a CMOS image sensor, a CIS image sensor, or the like, and may work in a visible light band or an infrared light band, the embodiments of the present disclosure are not limited in this aspect.

For example, in some embodiments, the movable device 20 further comprises an information transmission unit 23, the information transmission unit 23 can transmit information by a wireless manner and can send and receive data and/or instructions, etc., and the information transmission unit 23 can be signal-connected with the controller 21. For example, a command may be input to the controller 21 in a wireless manner to control the motion state of the movable device 20. For example, the information transmission unit 23 is also signal-connected to the image sensor 22, so as to transmit the image captured by the image sensor 22 in real time, and the image can be received by a receiving terminal, which is convenient for a user to monitor. For example, the information transmission unit 23 may be a communication unit based on various wireless communication standards such as WIFI, Bluetooth, ZigBee, 2G/3G/4G/5G mobile communication, and the like.

For example, in some embodiments, the movable device 20 further comprises a power source 24, the power source 24 powers at least the actuator 100, for example, the power source 24 may also power the image sensor 22 and the information transmission unit 23. For example, the power source 24 may be a primary battery, a rechargeable battery, or the like.

It should be noted that FIG. 12 only exemplarily shows that the movable device 20 comprises structures such as the controller 21, the image sensor 22, the information transmission unit 23, the power source 24, and the like. In the embodiments of the present disclosure, the above-mentioned components included in the movable device 20 may be disposed at different positions of the movable device 20 according to requirements, or the movable device 20 may further comprise other functional components, such as a light source for emitting light for capturing an image, and the embodiments of the present disclosure are not limited thereto.

For example, the movable device 20 provided by some embodiments of the present disclosure can be used in a field of medical equipment. Because the movable device 20 can be miniaturized, the movable device 20 can be used as a miniature robot that can enter the human body for monitoring and treatment. For example, the movable device 20 can enter the inside of a human body from a blood vessel of the human body, and obtain an image of the inside of the human body using the image sensor 22, thereby providing reference data for medical diagnosis. For another example, the movable device 20 can carry medicine into the human body and release the medicine to the lesion location, thereby achieving treatment and the like.

Figure 13:
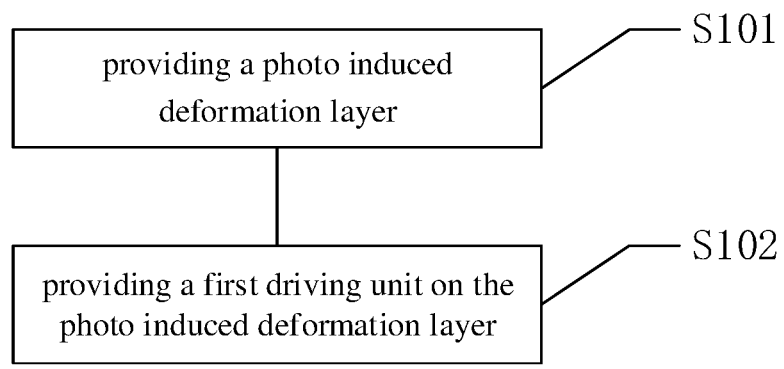
FIG. 13 is a flowchart of manufacturing an actuator according to some embodiments of the present disclosure.

At least one embodiment of the present disclosure provides a manufacture method for manufacturing an actuator. As shown in FIG. 13, the manufacture method comprises steps S101 and S102.

Step S101: providing a photodeformation layer.

For example, the photodeformation layer may be purchased or self-made. For example, taking the photodeformation layer comprising azobenzene as an example, a manufacturing process of the photodeformation layer is described in detail.

Figure 14:
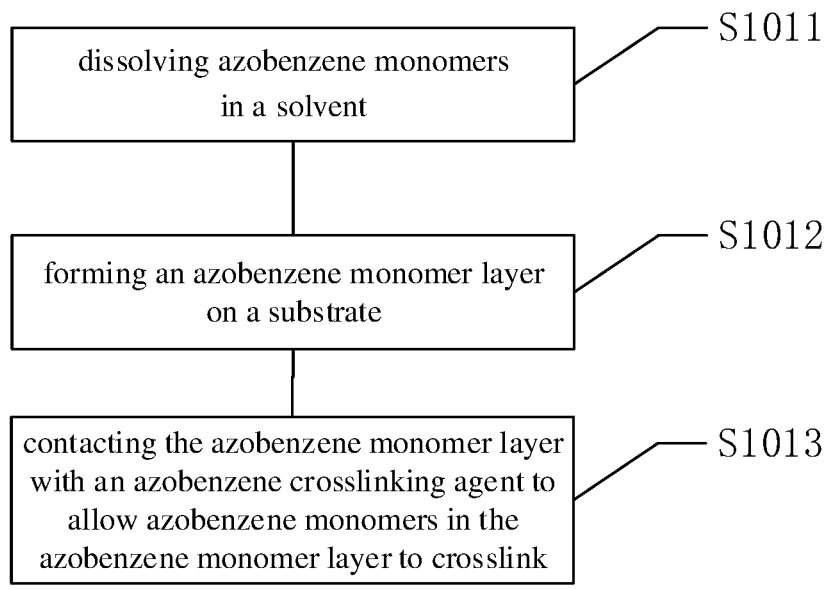
FIG. 14 is a flowchart of manufacturing a photodeformation layer of an actuator according to some embodiments of the present disclosure.

For example, in one example, as shown in FIG. 14, forming a photodeformation layer including azobenzene comprises steps S1011-S1013.

Step S1011: dissolving azobenzene monomers in a solvent.

For example, a molecular formula of the azobenzene monomer used in this example is as follows:

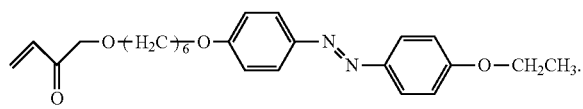

For example, the solvent used in this example is a volatile organic solvent, such as cyclohexanone, acetone, dichloromethane, and other organic solvent.

In this example, a proportion of the azobenzene monomers dissolved in the organic solvent can be selected according to the solubility of the azobenzene monomers in the selected solvent and the thickness to be formed of the azobenzene monomers, which is not limited in the example.

Step S1012: forming an azobenzene monomer layer on a substrate.

For example, after dissolving the azobenzene monomers in the solvent, an azobenzene monomer layer can be formed on the substrate by an inkjet printing method.

In this example, the formation thickness of the azobenzene monomer layer can be selected according to deformation requirements and the like, and this example does not limit the formation thickness of the azobenzene monomer layer.

Step S1013: contacting the azobenzene monomer layer with an azobenzene crosslinking agent to allow azobenzene monomers in the azobenzene monomer layer to crosslink.

For example, a molecular formula of the crosslinking agent used in this example is as follows:

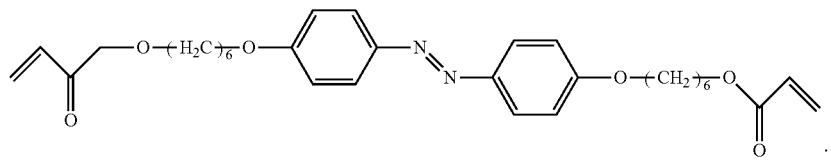

For example, the crosslinking agent is also used after being dissolved in the solvent, for example, the crosslinking agent is dissolved in the organic solvent which is the same as the organic solvent of azobenzene monomers. For example, the molar content of the azobenzene crosslinking agent dissolved in the organic solvent is about twice the molar content of the azobenzene monomers dissolved in the organic solvent, so that the azobenzene monomers in the azobenzene monomer layer can be sufficiently crosslinked.

For example, the azobenzene crosslinking agent may be sprayed on the azobenzene monomer layer by an inkjet printing method to contact the azobenzene monomer layer with the azobenzene crosslinking agent, so that the azobenzene monomers in the azobenzene monomer layer are crosslinked.

For example, after the crosslinking of the azobenzene monomers is completed, the cross-linked azobenzene material may be cured by a heating method or the like to form a photodeformation layer.

Step S102: providing a first driving unit on the photodeformation layer.

For example, a first driving unit is formed first, and then the first driving unit is disposed on the photodeformation layer.

The method for forming the first driving unit is described below by taking the first driving unit including a first light emitting device and the first light emitting device being an organic light emitting device as an example.

For example, forming the first light emitting device comprises forming a light emitting structure and a driving circuit that controls the light emitting structure to emit light, and the driving circuit comprises, for example, a thin film transistor having a switching function. For example, forming the light emitting structure comprises forming a first electrode, a second electrode, and a light emitting layer between the first electrode and the second electrode. Forming the thin film transistor comprises forming functional layers such as a gate electrode, an active layer, a source-drain electrode, and so on.

For example, a patterning process may be used to sequentially form the gate electrode, the active layer, the source-drain electrode, and other functional layers of the thin film transistor on a flexible substrate. For example, the flexible substrate may be formed of a transparent material having flexibility, for example, may be formed of organic materials such as polyimide, polycarbonate, polyethersulfone, polyethylene terephthalate, and the like. For example, one patterning process comprises steps of photoresist forming, exposing, developing, etching, and so on.

For example, after the thin film transistor is formed, the first electrode, the light emitting layer, and the second electrode of the light emitting structure are sequentially formed. For example, the first electrode is formed using a metal material such as Al, Ni, Co, or the like. For example, the first electrode may be formed by a sputtering method, an evaporation method, or the like. Then, the light emitting layer is formed on the first electrode by a method such as an evaporation method or an inkjet printing method. The light emitting layer can be selected as a material that can emit light of a specific color according to requirements. For example, in this example, the light emitting layer is selected as a material that can emit the first light with the first wavelength. For example, in some examples, one or more layers selected from a group consisting of a hole injection layer (HIL), a hole transport layer (HTL), an electron transport layer (EHL), and an electron injection layer (EIL) may be formed before and after the light emitting layer is formed, so as to enhance the light emitting effect. For example, after the light emitting layer is formed, the second electrode may be formed by using a method such as an evaporation method, a sputtering method, or the like. The second electrode may be formed using a metal such as Ag, Mg, or an alloy thereof, or a metal oxide such as IZO.

For example, after the first light emitting device is formed, the first light emitting device is encapsulated with a transparent flexible encapsulation material using a method such as deposition, so as to form a flexible encapsulation layer. For example, the encapsulation material comprises inorganic materials such as SiNX, SiCN, or organic materials such as polyimide, polycarbonate, polyethersulfone, polyethylene terephthalate, or the like.

For example, after the encapsulation of the first light emitting device is completed, an adhesive is used to attach the first light emitting diode device to a surface of the photodeformation layer through the flexible encapsulation layer. For example, the first light emitting device is connected to a first side of the photodeformation layer.

For example, after the encapsulation of the first light emitting device is completed, by a mechanical structure, such as a snap-fit structure, a plug-in structure, and the like, the first light emitting diode device is fixed to the surface of the photodeformation layer through the flexible encapsulation layer. For example, the first light emitting device is connected to the first side of the photodeformation layer.

In this example, the first light emitting device connected to the first side of the photodeformation layer can emit first light with a first wavelength, and the photodeformation layer can generate a first deformation under the irradiation of the first light. Thus, the actuator shown in FIG. 1A is formed.

For example, in some embodiments, the first driving unit further comprises another light emitting device. For example, the another light emitting device may be formed using substantially the same method as the first light emitting device, and then the another light emitting device is connected to the first side or the second side of the photodeformation layer.

For example, the another light emitting device is formed to emit second light with a second wavelength, and the photodeformation layer generates a second deformation under the irradiation of the second light, and the deformation directions of the first deformation and the second deformation are opposite. For example, under the irradiation of the second light with the second wavelength, the actuator that has generated the first deformation can be restored to the original state. Thus, the actuator as shown in FIG. 2A (in a case where the another light emitting diode device is attached to the first side of the photodeformation layer) is formed, or the actuator as shown in FIG. 8A (in a case where the another light emitting diode device is attached to the second side of the photodeformation layer) is formed.

For example, in some embodiments, more light emitting devices may be formed on the first side and the second side of the photodeformation layer, and these light emitting devices may also be formed and connected to the first side and/or the second side of the photodeformation layer by using the above method. For example, a plurality of light emitting devices located on the same side of the photodeformation layer can be formed on the same flexible substrate by the same manufacturing process and be encapsulated with the same encapsulation layer, so as to simplify the manufacturing process.

Figure 15:
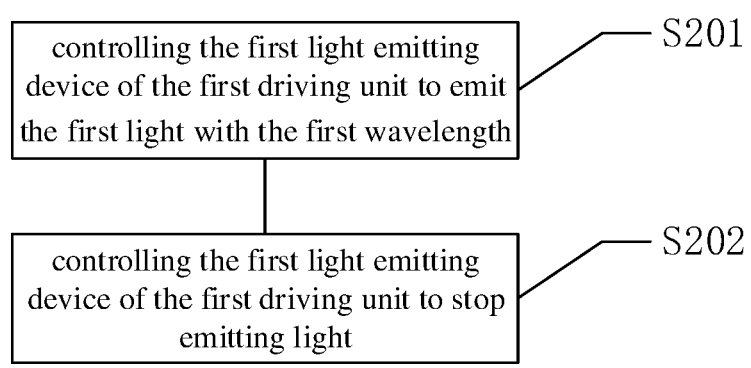
FIG. 15 is a flowchart of an operation method of an actuator according to some embodiments of the present disclosure.
Figure 16:
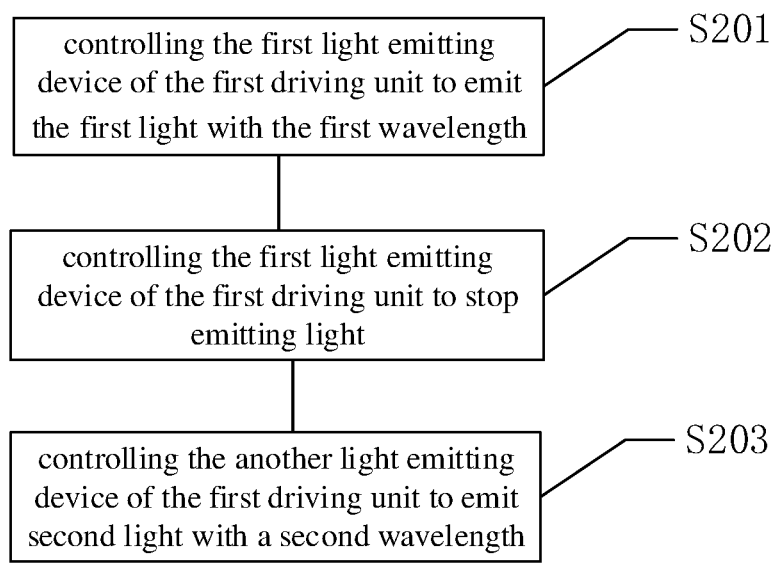
FIG. 16 is a flowchart of an operation method of another actuator according to some embodiments of the present disclosure.

At least one embodiment of the present disclosure provides an operation method for operating an actuator provided by the embodiments of the present disclosure. As shown in FIG. 15, the operation method comprises steps S201 to S202:

Step S201: controlling the first light emitting device of the first driving unit to emit the first light with the first wavelength.

Under the above control, the photodeformation layer can generate a first deformation.

Step S202: controlling the first light emitting device of the first driving unit to stop emitting light.

Under the above control, the photodeformation layer can generate a second deformation, and the first deformation and the second deformation are opposite. For example, the photodeformation layer that has generated the first deformation can be restored to the original state in a case of no light irradiating onto the photodeformation layer.

For example, in some embodiments, the first driving unit further comprises another light emitting device, and the another light emitting device is connected to the first side or the second side of the photodeformation layer (the first side and the second side of the photodeformation layer are opposite to each other), and in this case, the operation method of the actuator may further comprise step S203.

Step S203: controlling the another light emitting device of the first driving unit to emit second light with a second wavelength.

Under the above control, the photodeformation layer can quickly generate the second deformation. For example, the photodeformation layer that has generated the first deformation can be quickly restored to the original state under the irradiation of the second light with the second wavelength, thereby increasing the movement speed of the actuator.

For example, in a case where both sides of the photodeformation layer respectively comprise a plurality of light emitting devices, the light emitting states of the light emitting devices can be selectively controlled to allow the photodeformation layer to generate various deformations, thereby flexibly controlling the deformation form of the photodeformation layer, and further flexibly controlling the motion state of the actuator.

The following statements should be noted:

(1) The accompanying drawings of the embodiment(s) of the present disclosure involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or an area may be enlarged or narrowed, that is, the drawings are not drawn in a real scale. It should understood that, in the case where a component or element such as a layer, film, area, substrate or the like is referred to be "on" or "under" another component or element, the component or element may be directly on or under the another component or element or a component or element may be interposed therebetween.

(3) In case of no conflict, the embodiments of the present disclosure and features in the embodiments can be combined with each other to obtain new embodiments.

What have been described above are only specific implementations of the present disclosure, the protection scope of the present disclosure is not limited thereto. Any modifications or substitutions easily occur to those skilled in the art within the technical scope of the present disclosure should be within the protection scope of the present disclosure. Therefore, the protection scope of the present disclosure should be based on the protection scope of the claims.

What is claimed is:

1. An actuator, comprising:
a photodeformation layer; and
a first driving unit, comprising at least one first light emitting device, wherein the first light emitting device is on a first side of the photodeformation layer and is capable of emitting first light with a first wavelength to irradiate onto the photodeformation layer, so as to allow the photodeformation layer to generate a first deformation under irradiation of the first light,
wherein the first driving unit further comprises at least one second light emitting device, the second light emitting device is connected to a second side of the photodeformation layer, and is capable of emitting second light with a second wavelength to irradiate onto the photodeformation layer,
the photodeformation layer generates a second deformation under irradiation of the second light with the second wavelength,
the first wavelength is different from the second wavelength, a deformation direction of the first deformation and a deformation direction of the second deformation are opposite, and the first side and the second side of the photodeformation layer are opposite to each other,
the actuator further comprises a second driving unit, the second driving unit comprises at least on third light emitting device and at least one fourth light emitting device,
the third light emitting device is connected to the second side of the photodeformation layer, and is capable of emitting third light with the first wavelength to irradiate onto the photodeformation layer,
the fourth light emitting device is connected to the first side of the photodeformation layer, and is capable of emitting fourth light with the second wavelength to irradiate onto the photodeformation layer, and
in a direction perpendicular to a layer surface of the photodeformation layer, the third light emitting device and the fourth light emitting device are overlapped with each other.

2. The actuator according to claim 1, wherein a material of the photodeformation layer comprises: azobenzene, a triphenylmethane derivative, copolymers containing cinnamic acid groups, benzospiropyran, or a polyethylene polymer.

3. The actuator according to claim 1, wherein the first light emitting device comprised in the first driving unit is a light emitting diode device, and the light emitting diode device comprises a flexible substrate,
wherein the first light emitting diode device further comprises a flexible encapsulation layer, and is attached to a surface of the photodeformation layer through the flexible encapsulation layer.

4. The actuator according to claim 1, wherein the first wavelength is a blue light wavelength or an ultraviolet light wavelength, and the second wavelength is an infrared light wavelength.

5. A movable device, comprising at least one actuator according to claim 1 to drive the movable device.

6. The movable device according to claim 5, further comprising a controller, wherein the controller is configured to at least control a light emitting state of the first light emitting device in the actuator, thereby controlling the actuator to drive.

7. The movable device according to claim 6, further comprising an image sensor, wherein the image sensor is configured to shoot an external environment of the movable device.

8. A manufacture method of an actuator, comprising:
providing a photodeformation layer; and
providing a first driving unit on the photodeformation layer, the first driving unit comprising at least one first light emitting device, and the first light emitting device being on a first side of the photodeformation layer,
wherein the first light emitting device is capable of emitting first light with a first wavelength, so as to allow the photodeformation layer to generate a first deformation under irradiation of the first light,
wherein the first driving unit further comprises at least on fifth light emitting device, the fifth light emitting device is connected to a second side of the photodeformation layer, and is capable of emitting fifth light with a second wavelength to irradiate onto the photodeformation layer,
the photodeformation layer generates a second deformation under irradiation of the fifth light with the second wavelength,
the first wavelength is different from the second wavelength, a deformation direction of the first deformation and a deformation direction of the second deformation are opposite, and the first side and the second side of the photodeformation layer are opposite to each other,
the manufacture method further comprises: providing a second driving unit, wherein the second driving unit comprises at least one third light emitting device and at least one fourth light emitting device,
the third light emitting device is connected to the second side of the photodeformation layer, and is capable of emitting third light with the first wavelength to irradiate onto the photodeformation layer,
the fourth light emitting device is connected to the first side of the photodeformation layer, and is capable of emitting fourth light with the second wavelength to irradiate onto the photodeformation layer, and
in a direction perpendicular to a layer surface of the photodeformation layer, the third light emitting device and the fourth light emitting device are overlapped with each other.

9. The manufacture method according to claim 8, wherein the photodeformation layer comprises azobenzene, and wherein the providing the photodeformation layer comprises:
dissolving azobenzene monomers in a solvent;
forming an azobenzene monomer layer on a substrate; and
contacting the azobenzene monomer layer with an azobenzene crosslinking agent to allow azobenzene monomers in the azobenzene monomer layer to crosslink.

10. The manufacture method according to claim 9, wherein the azobenzene monomer layer is formed on the substrate by an inkjet printing method, and the azobenzene crosslinking agent is sprayed on the azobenzene monomer layer by an inkjet printing method.

11. An operation method of the actuator according to claim 1, comprising:
controlling the first light emitting device of the first driving unit to emit the first light with the first wavelength and controlling the third light emitting device of the second driving unit to emit the third light with the first wavelength, to allow the photodeformation layer to generate the first deformation; and
controlling the first light emitting device of the first driving unit to stop emitting light and controlling the third light emitting device of the second driving unit to stop emitting light, to allow the photodeformation layer to generate the second deformation.

12. The operation method according to claim 11,
further comprising:
controlling the second light emitting device to emit second light with the second wavelength and controlling the fourth light emitting device to emit fourth light with the second wavelength, to allow the photodeformation layer to generate the second deformation.

\* \* \* \* \*